ent [19]

[11] Patent Number: 4,570,331

Eaton, Jr. et al.

[45] Date of Patent: Feb. 18, 1986

[54] THICK OXIDE FIELD-SHIELD CMOS PROCESS

[75] Inventors: S. Sheffield Eaton, Jr.; Cheng-Cheng Hu, both of Colorado Springs, Colo.

[73] Assignee: Inmos Corporation, Colorado Springs, Colo.

[21] Appl. No.: 574,056

[22] Filed: Jan. 26, 1984

[51] Int. Cl.$^4$ .................... H01L 21/94; H01L 21/265
[52] U.S. Cl. ..................... 29/576 B; 29/571; 29/577 C; 148/1.5; 148/187; 148/DIG. 82; 357/44; 357/51
[58] Field of Search ............... 29/576 B, 577 C, 571, 29/576 W; 148/1.5, 187; 357/51, 44

[56] References Cited

U.S. PATENT DOCUMENTS

| | | | |
|---|---|---|---|
| 4,352,236 | 10/1982 | McCollum | 29/571 |
| 4,380,113 | 4/1983 | Malwah | 29/577 C |
| 4,391,032 | 7/1983 | Schulte | 29/571 |
| 4,411,058 | 10/1983 | Chen | 29/571 |
| 4,414,058 | 11/1983 | Mueller | 29/576 B |
| 4,441,246 | 4/1984 | Redwine | 29/571 |
| 4,466,177 | 8/1984 | Chao | 29/571 |
| 4,506,436 | 3/1985 | Bakeman, Jr. et al. | 29/577 C |
| 4,507,159 | 3/1985 | Erb | 29/577 C |

*Primary Examiner*—Upendra Roy
*Attorney, Agent, or Firm*—Edward D. Manzo

[57] ABSTRACT

An improved semiconductor structure and the method for fabricating such is disclosed. The invention relates to the use of thick-oxide for improved field-shield isolation especially as applied to dynamic RAMS's and also to its integration into an improved CMOS process. The improved structure has increased isolation characteristics between adjacent memory cells and still allows for lessened spacing between cells. The corresponding process determines the spacing between cells through etching and eliminates several steps by utilizing one mask for several purposes including defining the active transistor areas and the first polysilicon layer and by extending the use of the first polysilicon layer for field-shield isolation between cells. Additional advantages are disclosed including a higher body effect in the isolation transistors, use of a nitride dielectric layer, and a higher, stable threshold voltage in the isolation transistors. Also, modification of the improved process for fabrication of P-channel and N-channel devices can be made.

26 Claims, 10 Drawing Figures

THICK OXIDE FIELD-SHIELD CMOS PROCESS

BACKGROUND OF THE INVENTION

The present invention relates generally to the art of semiconductor fabrication. More particularly, the present invention relates to an improved isolation technique for CMOS memory cells. Even more particularly, the invention relates to the use of a thick oxide field shield CMOS fabrication process.

One of the most challenging problems in the present art of semiconductor fabrication is that of providing increased memory cell capacity on a single chip. Typically, as dynamic RAM sizes increase from 64K to 256K and on up to 1 megabyte levels, it becomes increasingly necessary to reduce the space between the memory cells so that the overall chip size remains reasonable. However, as the space between the memory cells is decreased, it becomes necessary to preserve the isolation characteristics of that intervening space. If this is not done, the accuracy of the memory chip becomes unacceptable because of leakage from one memory cell to another.

Similarly, the capacitance of each memory cell must be held relatively constant even as the number of memory cells per chip increases. It will be appreciated that this is essentially inconsistent with accepted notions of chip area scaling. The capacitance of the memory cell itself is important because of the alpha radiation which all chips are subjected to in our atmosphere. If the overall cell capacitance becomes too small, the memory cell will become readily neutralized by the impact of the alpha particles within the semiconductor cell structure.

Traditionally, N-channel dynamic RAM processes provide cell isolation using a local oxidation method which causes the space between cells to grow at every process step. Thus, the resulting space between cells is normally far greater that the minimum required to achieve acceptable isolation of memory cells. This result is inconsistant with the goal of adding additional memory cells to the same chip while at the same time maintaining a relatively constant overall size. Thus, it is desirable to use a new isolation method for separating the memory cells to be contained on one chip without unduly increasing the size of that chip.

Two conventional methods are known for providing the isolation between adjacent memory cells. The first of these is illustrated generally in FIG. 1A. Two adjacent transistors 2 and 4 are shown having a large growth of field oxide 5 between them. This oxide takes advantage of the fact that an isolation transistor 9 is naturally formed by the structure of the chip between each active transistor or memory cell. The field oxide serves to create a gate with a relatively high threshold voltage. Because this threshold voltage is normally higher the transient stimuli traditionally found on a memory chip, the transistor formed between the adjacent cells is always "off". This effectively isolates one memory cell from the next. However, because of the use of this field oxide 5, the size of the memory cells is inordinately limited when the chip is processed through the number of steps necessary to create a very large scale memory chip. As mentioned above, this field oxide 5 grows with each step and creates a resulting space between the cells which is far greater than the minimum space required to achieve acceptable isolation.

A second known method for achieving isolation between adjacent memory cells is illustrated generally in the naturally formed transistor 6 between adjacent memory cells 3 and 7. In this scheme the gate 8 of the intervening transistor is developed on a polysilicon base which is tied to ground. As in the scheme above, this keeps the intervening transistor in a perpetual "off" state, thus isolating the two memory cells.

However, while this method does not cause the space between cells to grow to an inordinate amount in the number of steps necessary to fabricate a semiconductor memory chip, it fails to solve the problem of reduced capacitance in the memory cells as they are scaled down in size. Specifically, the thin oxide used in this scheme allows only the most basic of dielectric materials to be used. The use of an enhanced dielectric such as silicon nitride would create an unstable isolation transistor in the resulting memory structure due to the charge trapped at the boundary between the thin oxide and the nitride.

The present invention therefore concerns the overall process of making larger memory devices and reconciling the space requirements of each memory cell with physical/electrical requirements.

Thus, a principal object of the present invention is to provide a method for fabrication of a semiconductor memory structure having a cell size adequate for capacitance purposes while at the same time permitting a one megabit memory without excessive space. It will be appreciated that a related object of the present invention is to provide for maximizing the number of memory cells which may be contained on a given chip.

A further object of the present invention is to allow for a greater capacitance in each memory cell without increasing the space necessary for that cell.

Still a further object of the present invention is to provide a CMOS fabrication process which will allow for the use of thick oxide field-shield isolation in peripheral circuits as well as in the memory circuit itself.

It will be appreciated then that an even further object of the present invention is to minimize the number of steps of growing, masking, and etching needed to fabricate a semiconductor memory cell device.

SUMMARY OF THE INVENTION

The present invention relates to the use of thick oxide for improved field-shield isolation in dynamic RAMs and also for integration into an improved CMOS fabrication process. The thick oxide field-shield CMOS process described herein allows for decreasing the space between memory cells subject only to structural electronic constraints. The present invention allows for this lessening through the use of an oxide etch process for determining the space between cells rather than the conventional oxide growth process. Additionally, in the present invention a new isolation method for dynamic memories has been developed which actually reduces the number of masks and process steps needed in the CMOS fabrication process. This feature of the present invention extends the use of the first polysilicon, level, normally used as a capacitor plate, for field-isolation between cells. Another aspect of the present invention provides for the use of a thicker field-shield oxide to develop a higher body effect. In this fashion, the threshold voltage of the isolation transistor can be raised to a high value with little effect on normal transistors which may be present in peripheral circuits on the chip. One further aspect of the present invention allows for the use of silicon nitride in the fabrication process without causing the destabilization of the isolation transistors while at the same time providing for a higher dielectric constant in the capacitance equation for the memory cell.

In essence, each memory cell on a semiconductor chip represents a pocket of capacitance in which a charge is stored as indicative of a memory state. The capacitance of each cell is given by the well-known equation:

$$C=(\epsilon A)/T$$

where C is the capacitance of the cell, $\epsilon$ (epsilon) is the dielectric constant, A is the area of the cell, and T is the thickness between the cell plates. It is well known that to maximize the capacitance of the cell it is necessary to either reduce the thickness T or increase the area A or the dielectric constant $\epsilon$. In the context of the present invention, it will be appreciated that the desired result is not to increase the area A because the overall goal is to decrease the size of the memory cell so as to increase the number of memory cells which may be located on a single chip. The present invention seeks to maximize the capacitance C by decreasing the thickness T, using an enhanced dielectric material to increase the dielectric constant $\epsilon$, and decreasing the practical, achievable spacing between memory cells.

Although the present invention allows for the use of smaller memory cells without reducing cell capacity and other uses which will be described more fully below, it is particularly useful in providing for adequate isolation between adjacent memory cells. The prior art has provided a number of processes which attempt to provide adequate isolation. However, as explained below, each of these suffers from an inherent failing when applied to the task of placing more memory cells on the same chip which the present process seeks to overcome. The particular advantages of the present invention will be better understood when viewed in conjunction with the following description. As a general note, the present invention seeks to replace the prior art and provide for the objectives as set out above.

BRIEF DESCRIPTION OF DRAWINGS

The invention, together with its objects and the advantages thereof, may best be understood by reference to the following detailed description taken in conjunction with the accompanying drawing of which.

DESCRIPTION OF PREFERRED EMBODIMENT

Figure 1A:
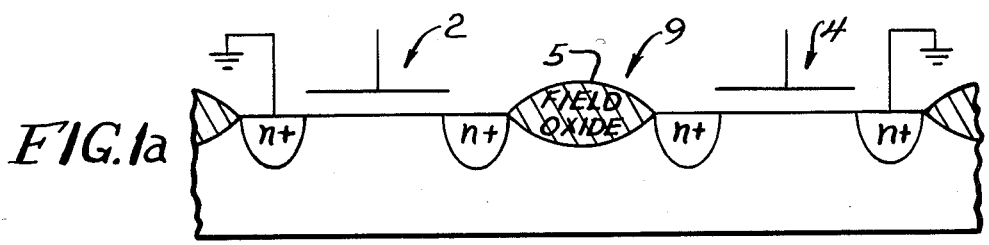
FIG. 1A is a representation of one method of field oxide isolation in the prior art.
Figure 1B:
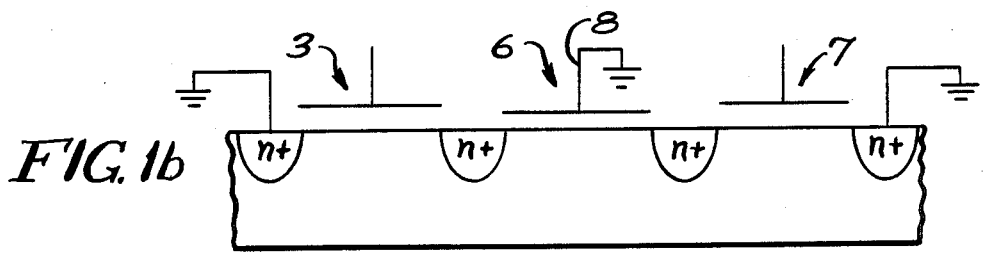
FIG. 1B is a general representation of a field-shield isolation method from the prior art.

Referring now to FIGS. 2A-E, the process of the preferred embodiment of the present invention begins with an unmasked $V_t$ adjust implant 11 used to adjust the threshold voltage of both the active enhancement transistors and the field shield isolation transistors. This is followed by a relatively thick oxide layer 12 which is grown onto the substrate 10. This region is typically about one thousand angstroms thick. The cell capacitors for the memory chip are then placed into the substrate itself by etching holes in the oxide defined by walls 14 and implanting arsenic, or other suitable doping material, to form the bottom plates 16 of each cell capacitor. Next, a thin layer of oxide 18, approximately fifty angstroms thick, is grown followed by a thin nitride layer 20, approximately one hundred fifty angstroms thick, which is deposited to form the capacitor dielectric. A first polysilicon layer 22 is then deposited and patterned to serve as the top capacitor plate and to form an "off" isolation transistor between adjacent memory cells. This polysilicon layer 22 will typically be grounded.

It will be appreciated that one of the main advantages of the above described method of cell isolation is that the space between memory cells is defined by an etch rather than a growth process. By lengthening the oxide etch time, the space (represented by reference numeral 12 in FIG. 2) between cells may be decreased, thus providing an ability for increasing the density of memory cells on the memory chip. This occurs because as the spaces between cells decreases, the area available for capacitative implants becomes proportionately greater. In this fashion high capacitance cells with small spacing is achieved which allows more cells to be placed in a given area without decreasing the individual cell capacity. Also, the use of the nitride layer provides a means for achieving a high capacitance in each cell at the same time allowing small spacing. Particularly, the arsenic implant and the grounded polysilicon capacitor plate in combination with the silicon nitride dielectric allow high cell capacitance while at the same time allowing proper cell isolation.

Figure 3:
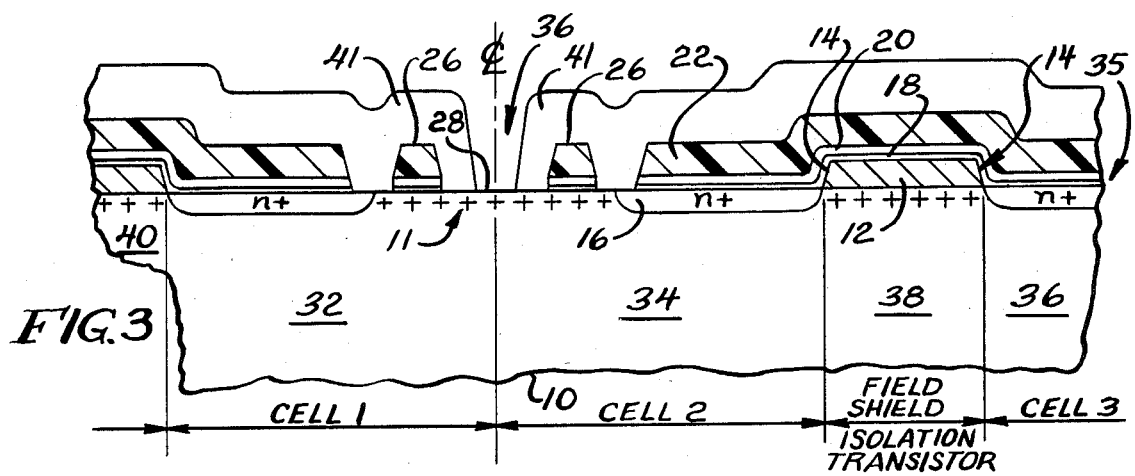
FIG. 3 is a cross-sectional view of a semiconductor memory structure made in accordance with one aspect of the preferred embodiment of the present invention.

FIG. 3 shows a cross-section through a memory chip showing memory cells of the present invention which have been fabricated according to the above-described process. This figure also shows additional components of the memory cells, specifically the $V_t$ implant 11, typically boron implants used to adjust the structure's threshold voltage, and the second polysilicon layer 26. A mutual contact 28 through contact hole 30 for a first memory cell 32 and a second memory cell 34 is shown at the center of FIG. 3. On the right hand side of FIG. 3 is shown the capacitor 35 of a third memory cell 36. From this diagram the advantage of the present process may be more fully appreciated as the space between memory cell 34 and memory cell 36 is clearly defined by the width of the oxide layer 12 and its etched walls 14. This space 38 corresponds to a second space 40 in the left hand side of FIG. 3. Mutual contact 28 provides the bit line contact for memory cell 32 and memory cell 34. Polysilicon layers 26 provide word line contacts for their respective memory cells. A final oxide layer 41 developed over the other layers protects the integrity of the structure.

A significant advantage of the present invention is that the space between adjacent memory cells is defined by etching. Thus, the spaces may be lessened by a longer etch. This is in contrast to prior art designs which use an oxidation process which would increase the space between the adjacent memory cells as the length of the process was increased. Also, the prior art field shield is unable to use silicon nitride as a dielectric in the fabrication process because an unstable transistor is normally created between the cells. The charge trapped by the oxide-nitride barrier creates a transistor with an unknown threshold voltage, thus providing unknown isolation characteristics.

The present invention surmounts this difficulty by placing the thin nitride next to the thick oxide in the ratio of approximately 150 to 1000. Again, this is provided by the use of the etching process rather than the growth process for depositing the oxide and defining the space between the cells. Thus, the use of the process of the present invention accomplishes the twin goals of reducing space between memory cells and increasing the memory capacity of cells having smaller areas.

Figure 4:
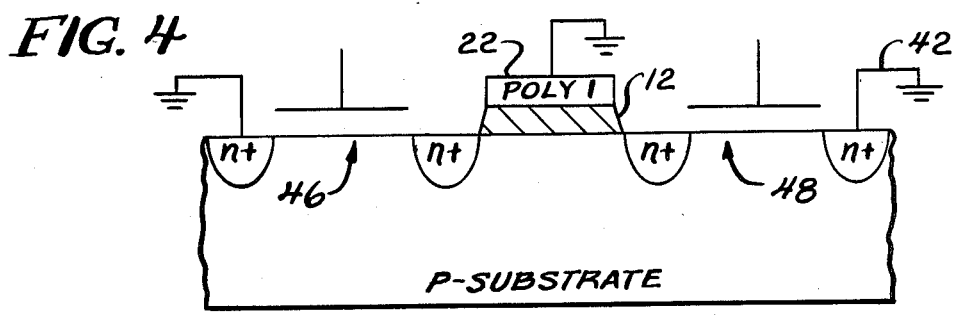
FIG. 4 is an cross-sectional view of a N-channel peripheral transistor structure made in accordance with the present invention.

The use of a relatively thick, approximately one thousand angstrom, field-shield oxide also leads to other advantages in the present invention. Specifically, the peripheral circuits on a memory chip may take advantage of the thick oxide to improve isolation characteristics. For N-channel transistors a back bias is provided as shown in FIG. 4 to lower the leakage between transistors and at the same time improve isolation. In effectuating this, the sources 42 and 44 of transistors 48 and 46 are tied to ground, as is polysilicon layer 22 above field oxide layer 12.

FIG. 4 illustrates in part schematic, part sectional form a peripheral circuit in a memory. It can be seen that thick oxide 12 extends to this region of the chip. Thick oxide 12 is covered at 22 with poly I. To the left and right of this structure are transistors 46 and 48 which are formed in openings in the thick oxide 12-poly 22 combination. As mentioned below, the polysilicon mask is used in this process to define active transistor areas. Thus, it will be understood that the relatively thick oxide 12 and polysilicon 22 may extend over the entire memory and be etched to form the field-shield isolation transistors between memory cells as illustrated in FIGS. 2 and 3 as well as the isolation transistors between transistors in the peripheral circuit of the memory.

Figure 5:
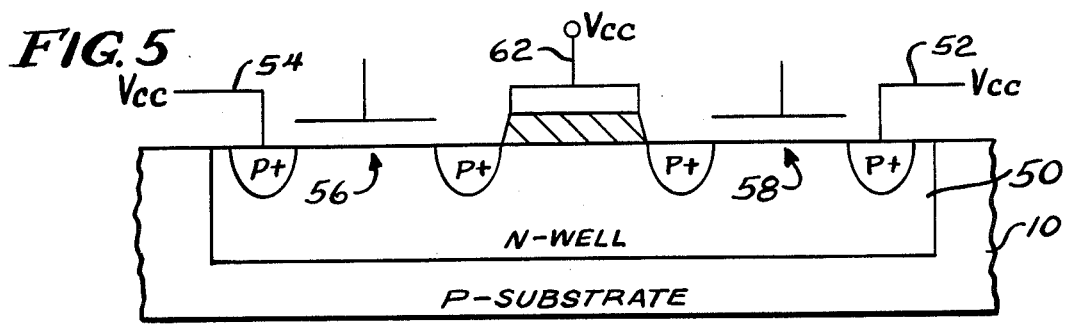
FIG. 5 is a cross-sectional view of a P-channel peripheral transistor structure made in accordance with the present invention.
Figure 2A:
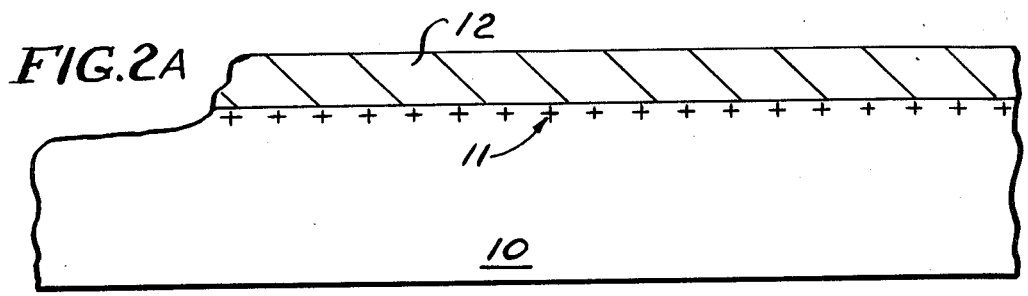
FIGS. 2-E are representational cross-sections of semiconductor memory cell structure being fabricated according to the process of the invention.
Figure 2B:
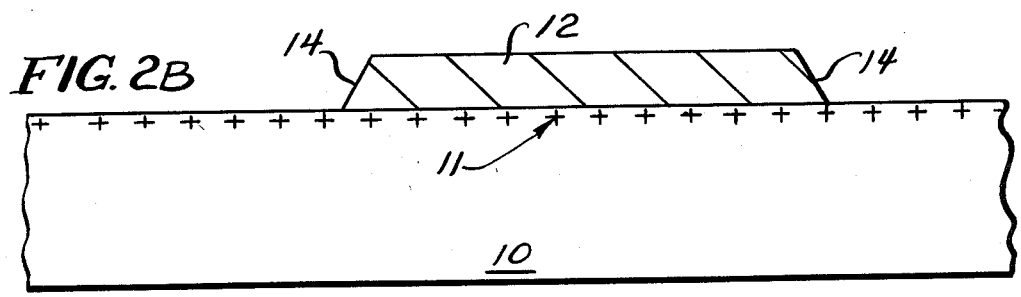
Figure 2C:
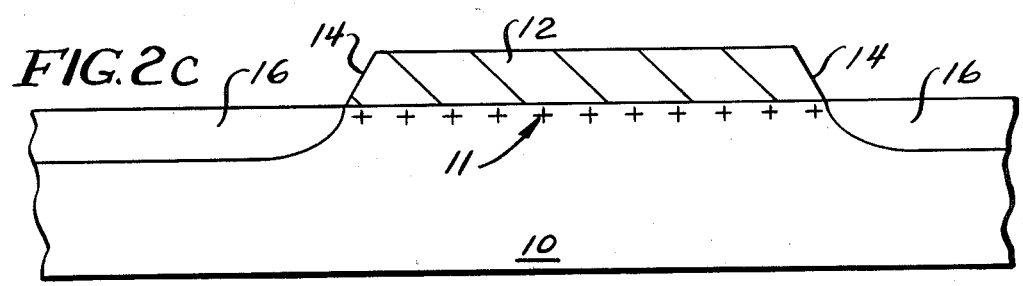
Figure 2D:
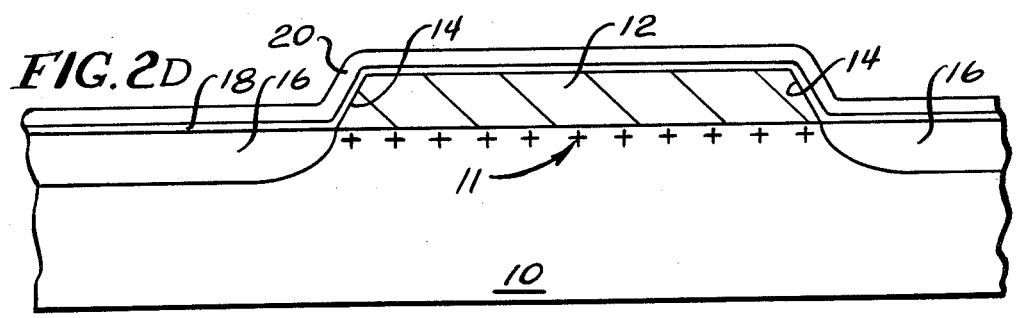
Figure 2E:
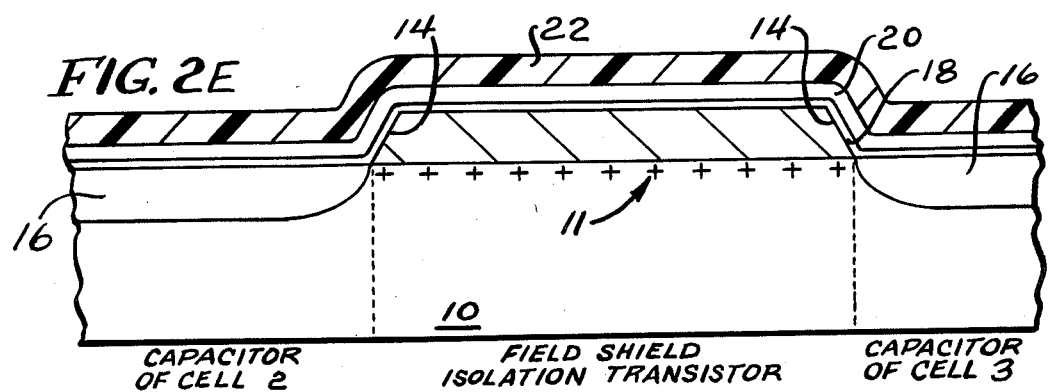

This process also allows for enchanced isolation in P-channel transistors as shown generally in FIG. 5. Therein, the P-substrate 10 has a N-well 50 defined in it which is tied to $V_{cc}$ by drains 54 and 52 of transistors 56 and 58. The gate 62 of isolation transistor 60 is also tied to $V_{cc}$. It should be noted that a high threshold voltage in the p-channel filed-shield isolation transistors is obtained naturally without a back bias because of the n+ doping of the polysilicon gate over a n-well region.

A third advantage of the thicker field-shield oxide is that a higher body effect is obtained. The body effect of the transistor is defined as the change in the threshold voltage divided by the change in the substrate voltage. It is known in the art that for isolation transistors, the higher the body effect, the greater the isolation properties. Thus, it can be seen that a thicker oxide will produce a higher body effect when the substrate is held to a constant voltage. This is particularly useful when the isolation is desired between two unrelated transistor drains. In the present process, and the novel products produced thereby, the higher threshold voltage on the isolation transistor is accomplished through the use of a thicker oxide without significantly effecting the threshold voltages of the other transistors on the chip.

The present invention also allows for a reduction in the number of steps necessary to accomplish the fabrication process. Specifically, in most conventional CMOS processes an active-area mask is used to define a transistor area. This is normally followed by a field implant mask for normal, local-oxidation, field isolation techniques. In the preferred embodiment of the present invention, both of these are eliminated. The field-shield implant is self-aligned with the well definition. Thus, this self-alignment feature of the implant (shown as element 11 in FIGS. 2 and 3), which may illustratively be boron, as mentioned, eliminates the need for a mask because the thick oxide in the well prevents the implant from entering the substrate thereunder. This results in self alignment, as mentioned. Moreover, a further mask saving occurs as follows. In standard LOCOS processes, a mask is used to define active regions of transistors, and a second mask is used to define the capacitor plates. In the present process, which as illustrated in FIG. 3 includes first and second layers of polysilicon, the first layer of polysilicon being used for field-shield isolation in combination with the thick oxide and the second polysilicon layer being used for other elements such as a word aligned contact 26, require only one mask where two masks were formerly required. That is, the same polysilicon mask which is used in defining the gate electrode or field-shield isolation transistors in the memory array is also used for creating openings in which transistors or other areas will be formed in the peripheral circuits as illustrated in FIG. 4, for example. Thus, FIG. 4 shows the relatively thick oxide 12 covered by first poly 22 with active area on each side of it in a peripheral circuit. This represents a saving of one mask in the process. Thus, the present invention allows for a cost savings in addition to providing for enhanced capacity and isolation of memory cells or transistors.

Although the present invention has been described herein in terms of the preferred embodiment, it is envisioned that the scope and spirit of the present invention encompass such changes and minor alterations as would normally be apparent to one skilled in the art and familiar with the teachings of this applcation.

What is claimed is:

1. In the fabrication of a semiconductor memory structure having a large number of memory cells each having a respective cell capacitance, the improvement in providing isolation between adjacent cells comprising the steps of:

developing a relatively thick oxide layer upon a silicon substrate; then etching holes through said oxide for charge storage regions whereby the space between memory cells is determined by an etching process; then introducing impurities into the substrate via said etched holes to form memory cell capacitor regions in the substrate;

forming a layer of an enhanced dielectric material over said capacitor regions and said relatively thick oxide without substantially increasing the thickness of said relatively thick oxide; and adding a capacitor plate over said enhanced dielectric layer and over said relatively thick oxide.

2. The method of claim 1 wherein said step of introducing impurities comprises implanting N-type impurities.

3. The method of claim 1 wherein said step of adding a capacitor plate comprises establishing a layer of polysilicon over said capacitor regions in said substrate.

4. The method of claim 1 wherein said relatively thick oxide layer developed on said substrate is about 1000 angstroms thick.

5. The method of claim 1 wherein said dielectric extends over said implanted regions and all unetched portions of said thick oxide.

6. The method of claim 1 further including:
implanting a threshold voltage adjustment implant into said silicon substrate.

7. The method of claim 5 wherein said dielectric comprises silicon nitride.

8. The method of claim 5 wherein said capacitor plate extends over all of said dielectric layer.

9. The method of claim 7 wherein said relatively thick oxide is about 1000 angstroms thick.

10. The method of claim 8 wherein said capacitor plate comprises polysilicon.

11. In the fabrication of a semiconductor memory having a large number of memory cells, an improved method for providing a stable field-shield isolation transistor between adjacent cells comprising:
developing a relatively thick oxide layer upon a silicon substrate between the location of memory cells;
developing a relatively thin layer of silicon nitride over said oxide layer; and
adding a polysilicon layer over the silicon nitride layer, said oxide layer being thick enough to compensate for the charge trapped at the oxide-nitride interface.

12. The method of claim 11 wherein said step of developing a relatively thick oxide layer comprises developing a layer of oxide about one thousand angstroms thick and defining said layer.

13. The method of claim 11 wherein said step of developing a relatively thin layer of silicon nitride comprises developing a layer about 150 angstroms thick.

14. In the fabrication of a semiconductor memory having a plurality of memory cells and transistors defined by the semiconductor structure between the cells, an improved method for providing isolation between memory cells comprising:
developing an oxide layer upon a silicon substrate; then
etching holes through said oxide so that the space between memory cells is determined by substantially only an etching process; then
implanting impurities into the etched holes to form source and drain regions of an isolation transistor;
adding a capacitor dielectric layer;
adding a layer to serve as a capacitor plate and a gate electrode over said dielectric layer between cells.

15. The method of claim 14 further including the step of grounding said gate electrode.

16. The method of claim 14 further including adjusting the threshold voltage of said isolation transistor between said cells.

17. The method of claim 14 including developing a relatively thick oxide layer upon a silicon substrate.

18. The method of claim 17 wherein said step of developing a relatively thick oxide layer comprises developing an oxide layer approximately 1000 angstroms thick.

19. In the fabrication of a semiconductor memory structure having a memory array and a proximately located peripheral area, the memory array including plural memory cells, the peripheral area including a plurality of N-channel transistors, a method for providing isolation between adjacent transistors in the peripheral area and for isolating memory cells comprising:
providing a relatively thick oxide layer upon a silicon substrate; then
etching holes through said oxide to provide spaces between gate electrodes to be formed for isolation transistors in both said peripheral area and said memory array, said spaces being defined by substantially only an etching process; then
introducing N-type impurities through said holes into said substrate to form source and drain regions for said isolation transistors adjacent said transistor gates;
adding a gate electrode for said isolation transistor;
tying said gate electrode to ground; and
providing a back bias to said substrate.

20. The method of claim 19 wherein said step of developing a relatively thick oxide layer comprises developing an oxide layer about 1000 angstroms thick.

21. The method of claim 19 wherein said isolation transistor gate electrode comprises polysilicon.

22. The method of claim 19 including adding a layer of nitride as a capacitor dielectric after said etching step, said capacitor dielectric being for the memory cells.

23. The method of claim 22 including forming active transistors in the peripheral area between the gate electrodes of said isolation transistors.

24. In the fabrication of a semiconductor memory structure having a memory array and a proximately located peripheral area, the memory array including plural memory cells, the peripheral area including a plurality of P-channel transistors a method for providing isolation between adjacent transistors a method for providing isolation between adjacent in the peripheral area and for isolating memory cells comprising:
defining an N-well in a substrate; then
providing a relatively thick oxide layer over said substrate; then
etching holes through said oxide to provide spaces between transistors in both said peripheral area and said memory array, said spaces being defined by substantially only an etching process; then
introducing impurities into said substrate through said holes to form source and drain regions for said isolation transistors;
adding at least one field-shield gate terminal over said relatively thick oxide,
tying said gate terminal in said N-well to a positive potential; and
tying said substrate to a negative voltage potential.

25. The method of claim 24 wherein said step of developing a relatively thick oxide layer comprises developing an oxide layer about 1000 angstroms thick.

26. The method of claim 24 wherein said step of adding a gate terminal comprises adding a layer of polysilicon over said space between transistors.

* * * * *